(12) United States Patent
Stanbery

(10) Patent No.: US 8,034,317 B2
(45) Date of Patent: Oct. 11, 2011

(54) ASSEMBLIES OF ANISOTROPIC NANOPARTICLES

(75) Inventor: Billy J. Stanbery, Austin, TX (US)

(73) Assignee: Heliovolt Corporation, Austin, TX (US)

( * ) Notice: Subject to any disclaimer, the term of this patent is extended or adjusted under 35 U.S.C. 154(b) by 505 days.

(21) Appl. No.: 11/820,294

(22) Filed: Jun. 18, 2007

(65) Prior Publication Data

US 2008/0311028 A1    Dec. 18, 2008

(51) Int. Cl.
| | |
|---|---|
| *C01B 19/04* | (2006.01) |
| *C07C 1/00* | (2006.01) |
| *B05D 3/02* | (2006.01) |
| *B05D 5/12* | (2006.01) |
| *B05D 1/36* | (2006.01) |
| *H01L 31/00* | (2006.01) |

(52) U.S. Cl. ............... 423/509; 204/157.15; 427/376.6; 427/74; 427/76; 427/266; 136/262; 136/264; 136/265; 977/786; 977/810

(58) Field of Classification Search .................. None
See application file for complete search history.

(56) References Cited

U.S. PATENT DOCUMENTS

| | | |
|---|---|---|
| 3,629,036 A | 12/1971 | Isaacson |
| 4,088,544 A | 5/1978 | Hutkin |
| 4,267,398 A | 5/1981 | Rothwarf |
| 4,315,097 A | 2/1982 | Solomon |
| 4,322,571 A | 3/1982 | Stanbery |
| 4,392,451 A | 7/1983 | Mickelsen et al. |
| 4,523,051 A | 6/1985 | Mickelsen et al. |
| RE31,968 E | 8/1985 | Mickelsen et al. |
| 4,571,448 A | 2/1986 | Barnett |
| 4,611,091 A | 9/1986 | Choudary et al. |
| 4,674,434 A | 6/1987 | Ishihara |
| 4,823,176 A | 4/1989 | Baliga et al. |
| 4,902,395 A | 2/1990 | Yoshimura |
| 5,028,274 A | 7/1991 | Basol et al. |
| 5,055,150 A | 10/1991 | Rosenfeld et al. |

(Continued)

FOREIGN PATENT DOCUMENTS

DE    4225385    7/1992

(Continued)

OTHER PUBLICATIONS

Hiraga et al.; Formation of Decagonal Quasicrystal in the Al-Pd-Mn System and Its Structure; Japanese Journal of Applied Physics; vol. 30, No. 9A, pp. 2028-2034; Sep. 1991.*

(Continued)

*Primary Examiner* — Melvin Mayes
*Assistant Examiner* — Guinever Gregorio
(74) *Attorney, Agent, or Firm* — Watov & Kipnes, P.C.

(57) ABSTRACT

A composition of matter, includes a plurality of anisotropic nanoparticles that are in physical contact with one another, each of the plurality of anisotropic nanoparticles having a) a first dimension that is substantially different than both a second dimension and a third dimension and b) a non-random nanoparticle crystallographic orientation that is substantially aligned with the first direction. The plurality a anisotropic nanoparticles are substantially aligned with respect to each other to define a substantially close packed dense layer having a non-random shared crystallographic orientation that is substantially aligned with a basal plane of the substantially close packed dense layer. The plurality of anisotropic nanoparticles includes a member selected from the group consisting of $(In,Ga)_y(S,Se)_{1-y}$, an $In_2Se_3$ stable wurtzite structure that defines a hexagonal rod nanoparticle, $Cu_x(Se)_{1-x}$ and $Cu(In,Ga)_y(S,Se)_{1-y}$.

16 Claims, 4 Drawing Sheets

U.S. PATENT DOCUMENTS

| | | | |
|---|---|---|---|
| 5,124,308 | A | 6/1992 | Albin et al. |
| 5,124,309 | A | 6/1992 | Albin et al. |
| 5,178,967 | A | 1/1993 | Rosenfeld et al. |
| 5,248,621 | A | 9/1993 | Sano |
| 5,298,449 | A | 3/1994 | Kikuchi |
| 5,396,839 | A | 3/1995 | Rice |
| 5,405,802 | A | 4/1995 | Yamagata et al. |
| 5,436,204 | A | 7/1995 | Albin et al. |
| 5,441,897 | A | 8/1995 | Noufi et al. |
| 5,477,088 | A | 12/1995 | Rockett et al. |
| 5,477,288 | A | 12/1995 | Miyazaki et al. |
| 5,567,469 | A | 10/1996 | Wada et al. |
| 5,578,503 | A | 11/1996 | Karg et al. |
| 5,626,688 | A | 5/1997 | Probst et al. |
| 5,674,555 | A | 10/1997 | Birkmire et al. |
| 5,705,011 | A | 1/1998 | Bodford et al. |
| 5,730,852 | A | 3/1998 | Bhattacharya et al. |
| 5,756,240 | A | 5/1998 | Roberts et al. |
| 5,858,121 | A | 1/1999 | Wada et al. |
| 5,858,628 | A | 1/1999 | Yoshida et al. |
| 5,948,176 | A | 9/1999 | Ramanathan et al. |
| 6,072,818 | A | 6/2000 | Hayakawa |
| 6,100,165 | A | 8/2000 | Sakaguchi et al. |
| 6,121,541 | A | 9/2000 | Arya |
| 6,146,979 | A | 11/2000 | Henley et al. |
| 6,187,653 | B1 | 2/2001 | Hui et al. |
| 6,190,453 | B1 | 2/2001 | Boydston et al. |
| 6,225,199 | B1 | 5/2001 | Han et al. |
| 6,251,754 | B1 | 6/2001 | Ohshima et al. |
| 6,313,479 | B1 | 11/2001 | Zhang et al. |
| 6,323,417 | B1 | 11/2001 | Gillespie et al. |
| 6,372,538 | B1 | 4/2002 | Wendt et al. |
| 6,399,486 | B1 | 6/2002 | Chen et al. |
| 6,455,398 | B1 | 9/2002 | Fonstad, Jr. et al. |
| 6,475,354 | B1 | 11/2002 | Toyama |
| 6,500,733 | B1 | 12/2002 | Stanbery |
| 6,521,511 | B1 | 2/2003 | Inoue et al. |
| 6,559,372 | B2 | 5/2003 | Stanbery |
| 6,593,213 | B2 | 7/2003 | Stanbery |
| 6,669,830 | B1 | 12/2003 | Inoue et al. |
| 6,720,239 | B2 | 4/2004 | Stanbery |
| 6,736,986 | B2 | 5/2004 | Stanbery |
| 6,787,012 | B2 | 9/2004 | Stanbery |
| 6,797,874 | B2 | 9/2004 | Stanbery |
| 6,852,920 | B2 | 2/2005 | Sager et al. |
| 6,855,202 | B2 * | 2/2005 | Alivisatos et al. ............... 117/68 |
| 6,881,647 | B2 | 4/2005 | Stanbery |
| 6,936,761 | B2 | 8/2005 | Pichler |
| 6,987,071 | B1 | 1/2006 | Bollman et al. |
| 7,045,205 | B1 | 5/2006 | Sager |
| 7,097,902 | B2 * | 8/2006 | Blanton et al. ................. 428/330 |
| 7,422,696 | B2 * | 9/2008 | Mirkin et al. ..................... 216/2 |
| 2002/0006470 | A1 | 1/2002 | Eberspacher et al. |
| 2002/0043279 | A1 | 4/2002 | Karg |
| 2003/0051664 | A1 | 3/2003 | Stanbery |
| 2003/0052391 | A1 | 3/2003 | Stanbery |
| 2003/0054582 | A1 | 3/2003 | Stanbery |
| 2003/0054662 | A1 | 3/2003 | Stanbery |
| 2003/0054663 | A1 | 3/2003 | Stanbery |
| 2003/0123167 | A1 | 7/2003 | Kolberg et al. |
| 2003/0201010 | A1 | 10/2003 | Koyanagi et al. |
| 2004/0063320 | A1 | 4/2004 | Hollars |
| 2004/0250848 | A1 | 12/2004 | Sager et al. |
| 2005/0095422 | A1 | 5/2005 | Sager et al. |
| 2005/0098204 | A1 | 5/2005 | Roscheisen et al. |
| 2005/0098205 | A1 | 5/2005 | Roscheisen et al. |
| 2005/0109392 | A1 | 5/2005 | Hollars |
| 2005/0121068 | A1 | 6/2005 | Sager et al. |
| 2005/0183767 | A1 | 8/2005 | Yu et al. |
| 2005/0183768 | A1 | 8/2005 | Roscheisen et al. |
| 2005/0186342 | A1 | 8/2005 | Sager et al. |
| 2005/0218377 | A1 | 10/2005 | Lawandy |
| 2006/0062902 | A1 | 3/2006 | Sager et al. |
| 2007/0077429 | A1 | 4/2007 | Mirkin et al. |
| 2007/0119522 | A1 * | 5/2007 | Grier et al. .................... 148/403 |
| 2007/0152236 | A1 * | 7/2007 | Halpert et al. ................. 257/183 |
| 2007/0163642 | A1 * | 7/2007 | Van Duren et al. ........... 136/262 |
| 2007/0234949 | A1 | 10/2007 | Ahn et al. |
| 2007/0261951 | A1 | 11/2007 | Ye et al. |
| 2008/0138501 | A1 * | 6/2008 | Yu et al. ........................... 427/74 |
| 2008/0142083 | A1 * | 6/2008 | Yu et al. ........................ 136/264 |
| 2008/0164239 | A1 * | 7/2008 | Mirkin et al. ................. 216/100 |
| 2008/0194103 | A1 | 8/2008 | Wagner |
| 2008/0242088 | A1 | 10/2008 | Suzuki |
| 2009/0226603 | A1 | 9/2009 | Lowrey |

FOREIGN PATENT DOCUMENTS

| | | |
|---|---|---|
| DE | 4225385 | 2/1994 |
| EP | 0381509 | 2/1990 |
| EP | 381509 | 8/1990 |
| EP | 0621130 | 4/1994 |
| EP | 0661760 | 12/1994 |
| EP | 61760 | 7/1995 |
| EP | 0763859 | 9/1996 |
| EP | 763859 | 3/1997 |
| EP | 0763859 | 3/1997 |
| EP | 621130 | 11/1997 |
| EP | 0989593 | 9/1999 |
| EP | 989593 | 3/2000 |
| EP | 1255305 | 6/2002 |
| EP | 1385365 | 3/2005 |
| WO | WO97/22152 | 6/1997 |
| WO | WO 97/22152 | 6/1997 |
| WO | WO 00/33363 | 6/2000 |
| WO | WO00/33363 | 6/2000 |
| WO | WO 03/002225 | 1/2003 |
| WO | WO 03/026022 | 3/2003 |
| WO | WO 03/026023 | 3/2003 |
| WO | WO 03/026024 | 3/2003 |
| WO | WO 03/026025 | 3/2003 |
| WO | WO 03/026026 | 3/2003 |
| WO | WO 03/026028 | 3/2003 |
| WO | WO 2005/017978 | 2/2005 |
| WO | WO 2005/059952 | 6/2005 |
| WO | WO2006041199 | 4/2006 |
| WO | WO 2006/133129 | 12/2006 |
| WO | WO 2006133129 A2 * | 12/2006 |
| WO | WO 2007/082080 | 7/2007 |
| WO | WO 2007/082084 | 7/2007 |
| WO | WO 2007/082085 | 7/2007 |
| WO | WO 2008/027571 | 3/2008 |

OTHER PUBLICATIONS

International Search Report and the Written Opinion, PCT/US2008/007612, Jan. 19, 2009.

Chun, et at., "Synthesis of CuInGaSe$_2$ nanoparticles by solvothermal route", Thin Solid Films, pp. 480-481(2005) 46-49.

Pinna, et al., "Triangular DdS Nanocrystals: Structural and Optical Studies", Advanced Materials, 2001, 13, No. 4, Feb. 19, pp. 261-264.

Characteristics of Indium Phosphide Solar Cells Bonded on Silicon—Lammasniemi, et al.; Tampere University of Technology, Tampere, Finland.1993.

XPS Studies of Sodium Compound Formation and Surface Segregation in CIGs Thin Films—Stanbery, et al.; 26th PVSC, Sep. 30-Oct. 3, 1997.

Evolution of the Phases and Chemical Composition During the Formation of CIS Thin Films prepared by Interdiffusion Process in Selenides Layers—Trhsriian, et al., Journals of Crystal Growth 183 (1998).

Role of Sodium of the Control of Defect Structures in CIS—Stanbery, et al.; 28th IEEE PCSC Anchorage, AK.

Effects of Buffer Layer Processing on CIGs Excess Carrier Lifetime: Application of Dual-beam Optical Modulation to Process—Sheng, et al.; 25TH PVSC; May 16-17, 1996.

Presentation and Characterization of CiInSe$_2$ Films for PV Applications by Low Pressure Vapor Phase Selenization—Nakada, et al.; 11th E.C. Photovoltaic Solar Energy Conference Oct. 12-16, 1992 Montreux, Switzerland.

Rapid CIS Process for High Efficiency PV-Modules: Development Towards Large-area Processing; Thin Solid Films 387 (2001) 262-267.

Thin Film Photovoltaics—Schock; Applied Surface Science 92 (1996) 606-616.

Advanced Stack Elemental Layer Process for Cu(InGa)Se$_2$ Thin Film Photovoltaic Devices—Probst, et al.; Mat. Res. Soc. Symp. Proc. vol. 426, 1196 Materials Research Society.

A 15.2% AM0 / 1433 w/kg Thin Film Cu(In,Ga)Se$_2$ Solar Cell for Space Applications—Tuttle, et al.; 2000.

Influence of Sodium on the Growth of Polycrystalline Cu(In,Ga)Se$_2$ Thin Films—Brauger, et al.; Thin Solid Films 361-362 (2000) 161-166.

Room Temperature Tailoring of Electrical Properties of Ternary and Multinary Chalcogenide Semiconductors—Cahen, et al.; Jpn. J. Appl. Phys. vol. 32 (1993) Suppl. 32-3, pp. 660-661.

Novel Multiplayer Process for CuInSe$_2$ Thin Film Formation by Rapid Thermal Processing—Chang, et al.; Mat. Res. Soc. Symp. Proc. vol. 485, 1998 Materials Research Society.

Thin Film CuInGaSe$_2$ Cell Development, Chen, et al.,1993.

Progress Toward 20% Efficacy in Cu(In,Ga)Se$_2$ Polycrystalline Thin-film Solar Cells—Contreras, et al.; Prog. Photovolt Res. Appl. 7, 311-316 (1999).

Non-vacuum Techniques for Fabricating Thin-film CIGs—Eberspacher, et al., 2000.

Reaction Pathways to CuInSe$_2$ Formation from Electrodeposited Precursors—Guillen, et al.; J. Electrochem. Soc., vol. 142, No. 6, Jun. 1995.

Field-assisted Bonding Below 200 degrees C Using Metal and Glass Thin-film Interlayers—Lee, et al.; Appl. Phys. Lett. , vol. 50, No. 9, Mar. 2, 1987.

Influence of Na on the Electro-optical Properties of Cu(InGa)Se$_2$—Keyes, et al.; NREL/CP-530-22963, UC Category: 1250.

Evaluation and Characterization of Polycrystalline CuInSe$_2$ Thin Films Prepared by the Sandwich Structure Technique—Hassan, et al.; 0268-1242/94 061255+06.

Direct Cover Glass Bonding to GaAs and GaAs/Ge Solar Cells—Nowlan, et al.; CH2953-8/91/0000-1480, 1991 IEEE.

Thin-film CuInSe$_2$/CdS Heterojunction Solar Cells—Kazmerski, et al.; Applied Business Letters, vol. 29, No. 4, Aug. 15, 1976.

The Intra-absorber Junction (IAJ) Model for the Device Physics of Copper Indium Selenide-based Photovoltaics—Stanbery; 0-7803-8707-4/05.

Solar Cells and Submodules on CIS Prepared by EDCF Method—Arya, et al.; 23 IEEE Photovoltiac Specialists Conference, Louisville, KY, May 1993.

Chemical Fluctuation-induced Nanodomains in Cu(In, Ga)Se$_2$ Films—Yan, et al.; Applied Physics Letters 87, (2005).

Above cited material, *Chemical Fluctuation-induced Nanodomains in Cu(In, Ga)Se$_2$ Films—Yan, et al.; Applied Physics Letters 87,* (2005), *National Renewable Energy Laboratory (NREL)*, Golden CO 80401, USA—rommel_noufi@nrel.gov.

Copper Indium Selenides and Related Materials for Photovoltaic Devices—Stanbery; Critical Reviews in Solid State and Material Sciences, 27(2):73-117 (2002).

Processing of CuInSe$_2$-Based Solar Cells: Characterization of Deposition Processes in Terms of Chemical Reaction Analyses, *Final Report* (May 6, 1995-Dec. 31, 1998—Anderson, et al.; NREL/SR-520-30391.

International search report PCT/US07/000940, date of mailing of the international search report—Jul. 24, 2008.

International search report PCT/US07/000941, date of mailing of the international search report—Jul. 24, 2008.

International search report PCT/US07/000935, date of mailing of the international search report—Jul. 24, 2008.

International search report PCT/US02/29529, date of mailing of the international search report—Sep. 17, 2003.

International search report PCT/US02/29608, date of mailing of the international search report—Sep. 23, 2003.

International search report PCT/US02/29684, date of mailing of the international search report—Sep. 16, 2003.

International search report PCT/US02/29607, date of mailing of the international search report—Sep. 17, 2003.

International search report PCT/US02/29605, date of mailing of the international search report—Sep. 23, 2003.

International search report PCT/US02/29701, date of mailing of the international search report—Sep. 23, 2003.

Novel single-molecule precursor routes for the direct synthesis of InS and InSe quantum dots—Revaprasadu, et al.; J. Mater. Chem., 1999, 9, 2885-2888.

Catalyzed Growth of a Metastable InS Crystal Structure as Collidial Crystals—Hollingsworth, et al.; J. Am. Chem. Soc. 2000, 122, 3562-3563.

The Spectroscopy of InSe Nanoparticles—Yang, et al.; J. Phys. Chem. B 2005,109, 12701-12709.

Five-fold Symmetry in Crystalline Quasicrystal Lattices—Caspar, et al.,;Proc. Nat. Acad. Sci. USA, vol. 93, pp. 14271-14278, Dec. 1996.

Epitaxial Growth of Highly Luminescent CdSe/CdS Core/Shell Nanocrystals with Photostability and Electronic Accessibility—Peng, et al.; J. Am. Chem. Soc. 1997, 7019-7029.

Elemental Solvothermal Reaction to Produce Ternary Semiconductor CuInE$_2$(E=S, Se) Nanorods—Jiang, et al.; Inorg. Chem. 2000, 39, 2964-2965.

Collidial Nanocrystal Synthesis and the Organic-inorganic Interface—Yin, et al.; Nature, vol. 437, Sep. 29, 2005.

The Effect of Organic Ligand Binding on the Growth of CdSe Nanoparticles Probed by Ab Initio Calculations—Puzder, et al.; Nano Letters 2004, vol. 4, No. 12, 2361-2365.

First-Principles Modeling of Unpassivated and Surfactant-Passivated Bulk Facets of Wurtzite CdSe: A Model System for Studying the Anisotropic Growth of CdSe Nanocrystals—Manna, et al.; J. Phys. Chem. B 2005, 109, 6183-6192.

Electroluminescent Properties of Device Based on ZnS;Tb/CdS Core-shell Nanocrystals—Hua, et al.; Chemical Physics Letters 419 (2006) 269-272.

Synthesis and Characterization of Monodisperse Nanocrystals and Close-packed Nanopcrystal Assemblies—Murray, et al.; Annu. Rev. Mater. Sci. 2000, 30: 545-610.

Synthesis of CuInGaSe$_2$ nanoparticles by solvothermal route—Chun, et al.; Thin Solid Films 480-481 (2005), 46-49.

Synthesis by a Solvothermal Route and Characterization of CuInSe$_2$ Nanowhiskers and Nanowhiskers—Li, et al.; Adv. Mater. 1999, 11, No. 17.

Microwave-assisted Polyol Synthesis of CuInTe$_2$ and CuInSe$_2$ Nanoparticles—Grisaru, et al.; Inorg. Chem. 2003, 42, 7148-7155.

Sonochemical Process for the Preparation of α-CuSe Nanocrystals and Flakes—Li, et al.; J. Mater. Chem., 2002, 12, 3723-3727.

Sonochemical Synthesis of Copper Selenides Nanocrystals with Different Pahses—Xu, et al.; Journal of Crystal Growth 234 (2002), 263-266.

Shape Control of II-VI Semiconductor Nanomaterials—Kumar, et al.; small 2006, 2, No. 3, 316-329.

Chemistry and Properties of Nanocrystals of Different Shapes—Burda, et al.; Chem. Rev. 2005, 105, 1025-1102.

Cyganik et al. (Substructure Formation during Pattern Transposition from Substrate into Polymer Blend Film), Europhysics Letters, vol. 62, No. 6, Apr. 29, 2003.

Li et al. "Effects of buffer layer processing on CIGS excess carrier lifetime: application of dual-beam optical modulation to process analysis," 0-7803-3166-4/96 IEEE 25th PVSC (May 13-17, 1996) Washington, D.C., pp. 821-824.

Noufi et al. "Chemical-fluctuation-induced nanodomains in Cu(In,Ga)Se2 films," 20th European Photovoltaic Solar Energy Conference, Jun. 6-10, 2005, Barcelona, Spain, pp. 1744-1747.

Park et al., Phase-controlled One-Dimensional Shape Evolution of InSe Nanocrystals; J.Am. Chem. Soc., 2006, 128, 14780-14781.

Probst et al., "The Impact of Controlled Sodium Incorporation on Rapid Thermal Processed Du(InGa)Se.sub.2—Thin Films and Devices," First WCPEC; Dec. 5-9, 1994; Hawaii; CH3365-4/94/0000-0144 IEEE, pp. 144-147.

\* cited by examiner

ASSEMBLIES OF ANISOTROPIC NANOPARTICLES

BACKGROUND INFORMATION

1. Field of the Invention

Embodiments of the invention relate generally to the field of assemblies of anisotropic nanoparticles. Some embodiments of the invention relate to the field of highly aligned assemblies of anisotropic nanoparticles. Some embodiments of the invention relate to impurity distributed assemblies of anisotropic nanoparticles. More particularly, some embodiments of the invention relate to compositions of matter including highly aligned, impurity distributing anisotropic nanoparticles and methods of making structures including highly aligned, impurity distributing anisotropic nanoparticles.

2. Discussion of the Related Art

Topotaxy is known to those skilled in the art of materials science. The term 'topotaxy' was defined by Lotgering and Gorter to include "all chemical solid state reactions that lead to a material with crystal orientations which are correlated with crystal orientations in the initial product".

A problem with this technology has been that the production of a dimensionally large material shape requires a correspondingly large initial product. One unsatisfactory approach, in an attempt to solve the above-discussed problem involves the use of a single crystal as the initial product. However, a disadvantage of this approach is that for a given material of interest, a single crystal initial product having appropriate lattice parameters, that is also of the desired size and shape may not be available. Another disadvantage of this approach has been that even if an appropriately sized and shaped single crystal initial product is available, it may be prohibitively expensive for use as a chemical reactant. Therefore, what is needed is a solution that provides initial products having the necessary lattice parameters that are also of suitable size and shape. What is also needed is a solution that meets the above-discussed requirements in a more cost-effective manner.

Meanwhile, it has been known in the field of materials science to utilize impurities to facilitate chemical reactions. Also impurities may be desirable in a final product, as in most semiconductor devices. The nature and extent of the effect of the impurities depends on their concentration, location and interactions with the host material(s).

A problem with this technology is that providing beneficial impurities in the proper concentration and location (e.g., homogeneously throughout a reactant/reaction) can be difficult and/or expensive. For instance, ion implantation is spatially accurate and precise, but it is very expensive. Another problem with this technology is that impurities can diffuse, thereby exacerbating concentration and location issues, especially in liquid and/or gas state reactions. Therefore, what is needed is a solution that provides a beneficial impurity in the correct location and at a precise concentration. What is also needed is a solution that provides a beneficial impurity introduction method that is resistant to undesirable diffusion.

Heretofore, the requirements of providing 1) initial products for topotaxy that have the necessary size, shape and lattice parameters and 2) beneficial impurities in the correct location and concentration that are resistant to undesirable diffusion have not been fully met. What is needed is a solution that solves all of these problems.

SUMMARY OF THE INVENTION

There is a need for the following embodiments of the invention. Of course, the invention is not limited to these embodiments.

According to an embodiment of the invention, a composition of matter comprises: a plurality of anisotropic nanoparticles that are in physical contact with one another, each of the plurality of anisotropic nanoparticles having a) a first dimension that is substantially different than both a second dimension and a third dimension and b) a non-random nanoparticle crystallographic orientation that is substantially aligned with the first direction, wherein the plurality of anisotropic nanoparticles are substantially aligned with respect to each other to define a substantially close packed dense layer having a non-random shared crystallographic orientation that is substantially aligned with a basal plane of the substantially close packed dense layer. According to another embodiment of the invention, a process comprises: forming a substantially close packed dense layer by assembling a plurality of anisotropic nanoparticles, each of the plurality of anisotropic nanoparticles having a) a first dimension that is substantially different than both a second dimension and a third dimension and b) a non-random nanoparticle crystallographic orientation that is substantially aligned with the first direction, wherein assembling includes mechanically interacting the plurality of anisotropic nanoparticles by imposing a delocalized force that defines a direction that is substantially perpendicular to a basal plane of the substantially closed packed dense layer; and imposing a fluctuating force to which the anisotropic nanoparticles respond, wherein fluctuations in a magnitude of the imposed force are sufficient to overcome a short range weak attractive force between members of the plurality of anisotropic nanoparticles with respect to anisotropic nanoparticles that are not substantially overlapping, wherein the plurality of anisotropic nanoparticles are substantially aligned with respect to each other to define the substantially close packed dense layer and the substantially closed packed dense layer has a non-random shared crystallographic orientation that is substantially aligned with the basal plane of the substantially close packed dense layer.

These, and other, embodiments of the invention will be better appreciated and understood when considered in conjunction with the following description and the accompanying drawings. It should be understood, however, that the following description, while indicating various embodiments of the invention and numerous specific details thereof, is given for the purpose of illustration and does not imply limitation. Many substitutions, modifications, additions and/or rearrangements may be made within the scope of an embodiment of the invention without departing from the spirit thereof, and embodiments of the invention include all such substitutions, modifications, additions and/or rearrangements.

BRIEF DESCRIPTION OF THE DRAWINGS

The drawings accompanying and forming part of this specification are included to depict certain embodiments of the invention. A clearer concept of embodiments of the invention, and of components combinable with embodiments of the invention, and operation of systems provided with embodiments of the invention, will be readily apparent by referring to the exemplary, and therefore nonlimiting, embodiments illustrated in the drawings (wherein identical reference numerals (if they occur in more than one view) designate the same elements). Embodiments of the invention may be better understood by reference to one or more of these drawings in combination with the following description presented herein. It should be noted that the features illustrated in the drawings are not necessarily drawn to scale.

DESCRIPTION OF PREFERRED EMBODIMENTS

Figure 1:
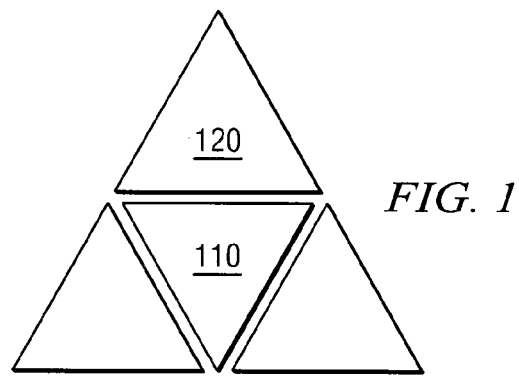
FIG. 1 is a schematic plan view of two aligned subsets of triangular nanoparticles that are different from one another, representing an embodiment of the invention.

Embodiments of the invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the embodiments of the invention in detail. It should be understood, however, that the detailed description and the specific examples, while indicating preferred embodiments of the invention, are given by way of illustration only and not by way of limitation. Various substitutions, modifications, additions and/or rearrangements within the spirit and/or scope of the underlying inventive concept will become apparent to those skilled in the art from this disclosure.

Within this application several publications are referenced by Arabic numerals, or principal author's name followed by year of publication, within parentheses or brackets. Full citations for these, and other, publications may be found at the end of the specification immediately preceding the claims after the section heading References. The disclosures of all these publications in their entireties are hereby expressly incorporated by reference herein for the purpose of indicating the background of embodiments of the invention and illustrating the state of the art.

In general, the context of embodiments of the invention can include the assembly of anisotropic nanoparticles. The context of an embodiment of the invention can include preparing chemical reactant containing precursors for pressure contained processing. The context of an embodiment of the invention can also include further processing and incorporating the corresponding chemical products into devices such as photodiodes (e.g., photovoltaics).

The invention can utilize liquid precursors that include solid state nanoparticles to form a substantially close packed dense layer having a non-random shared crystallographic orientation that is substantially aligned with a basal plane of the substantially close packed dense layer. The substantially closed packed dense layer can be characterized by a packing factor that is within at least 25%, 20%, 15%, 10%, 5%, 1%, 0.5%, or 0.1% of a maximum packing factor. The liquid precursor can include solvents, dispersants and surfactant in addition to the solid state nanoparticles.

The invention can include a first set of anisotropic nanoparticles and a second set of anisotropic nanoparticles, wherein the first set of anisotropic nanoparticles and the second set of anisotropic nanoparticles are different from one another with regard to at least one state variable selected from the group consisting of principle plane plan, minor plane profile, impurity presence, electrostatic edge charge, electrostatic surface charge, edge acidity, surface acidity, edge hydrophilicity and surface hydrophilicity. The invention can include a plurality of isotropic nanoparticles coupled to the plurality of anisotropic nanoparticles.

The invention can include anisotropic nanoparticles that include $(In,Ga)_y(S,Se)_{1-y}$. The invention can include anisotropic nanoparticles that includes $Cu_x(Se)_{1-x}$. The invention can include anisotropic nanoparticles that include $Cu(In,Ga)_y(S,Se)_{1-y}$. The invention can include a substrate coupled to the substantially close packed dense layer. The invention can include a plurality of anisotropic nanoparticles that are fused.

Figure 9:
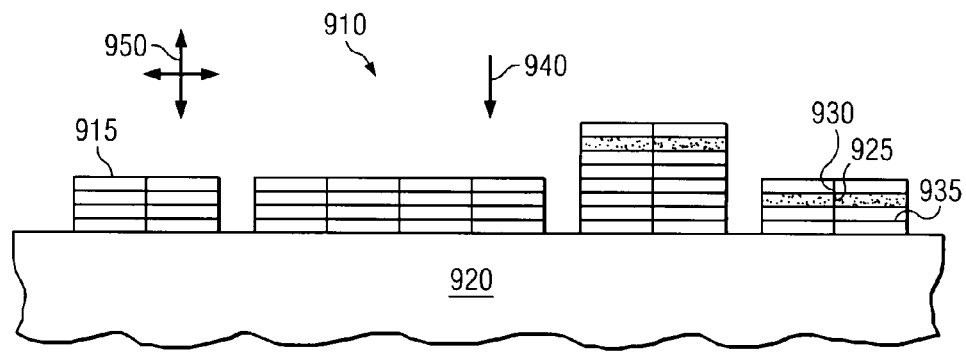
FIG. 9 is a schematic view of a substantially close packed dense layer including a plurality of anisotropic nanoparticles upon a substrate, representing an embodiment of the invention.

Referring to FIG. 9, a process of forming a substantially close packed dense layer 910 by assembling a plurality of anisotropic nanoparticles (nanoplatelets 915) upon a substrate 920 is shown. Each of the plurality of anisotropic nanoparticles has a first dimension 925 that is substantially smaller than both a second dimension and a third dimension. Each of the plurality of anisotropic nanoparticles also has a non-random nanoparticle crystallographic orientation 930 that is substantially aligned with the first direction. In FIG. 9, the basal plane 935 of these anisotropic nanoparticles is perpendicular to the first direction. Assembling includes mechanically interacting the plurality of anisotropic nanoparticles by imposing a delocalized force (gravity 940) that defines a direction that is substantially perpendicular to a basal plane of the substantially closed packed dense layer; and imposing a fluctuating force (ultrasonic sinusoidal signal 950 whose orthogonal components are shown) to which the anisotropic nanoparticles respond. In the process of FIG. 9, fluctuations in a magnitude of the imposed force are sufficient to overcome a short range weak attractive force between members of the plurality of anisotropic nanoparticles with respect to anisotropic nanoparticles that are not substantially overlapping. Upon completion, the plurality of anisotropic nanoparticles will be substantially aligned with respect to each other to define the substantially close packed dense layer and the substantially closed packed dense layer will have a non-random shared crystallographic orientation that is substantially aligned with the basal plane of the substantially close packed dense layer. The invention can include anisotropic nanoparticles that define platelets having an aspect ratio of less than approximately 0.40, 0.20, 0.10 or 0.05 and defining a principle plane that is substantially parallel to the basal plane.

Figure 10:
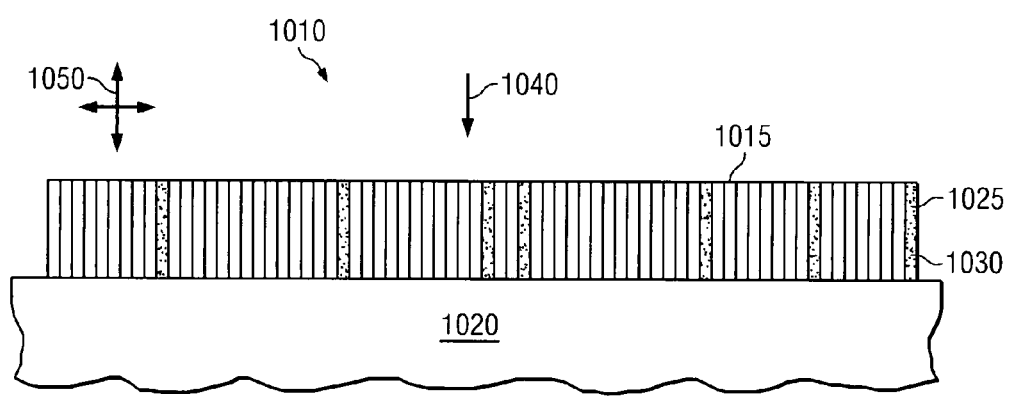
FIG. 10 is a schematic view of another substantially close packed dense layer including a plurality of anisotropic nanoparticles upon a substrate, representing an embodiment of the invention.

Referring to FIG. 10, another process of forming a substantially close packed dense layer 1010 by assembling a plurality of anisotropic nanoparticles (nanorods 1015) upon a substrate 1020 is shown. Each of the plurality of anisotropic nanoparticles has a first dimension 1025 that is substantially larger than both a second dimension and a third dimension. Each of the plurality of anisotropic nanoparticles also has a non-random nanoparticle crystallographic orientation 1030 that is substantially aligned with the first direction. In FIG. 10, the basal plane of these anisotropic nanoparticles is perpendicular to the first direction. Assembling includes mechanically interacting the plurality of anisotropic nanoparticles by imposing a delocalized force (an electrostatic field 1040) that defines a direction that is substantially perpendicular to a basal plane of the substantially closed packed dense layer; and imposing a fluctuating force (electromagnetic sinusoidal signal 1050 whose orthogonal components are shown) to which the anisotropic nanoparticles respond. In the process of FIG. 10 fluctuations in a magnitude of the imposed force are sufficient to overcome a short range weak attractive force between members of the plurality of anisotropic nanoparticles with respect to anisotropic nanoparticles that are not substantially overlapping. Upon completion, the plurality of anisotropic nanoparticles 1015 will be substantially aligned with respect to each other to define the substantially close packed dense layer and the substantially closed packed dense layer will have a non-random shared crystallographic orientation that is substantially aligned with the basal plane of the substantially close packed dense layer. The invention can include anisotropic nanoparticles that define nanorods having an aspect ratio of greater than approximately 2.5, 5.0, 10.0 or 20.0 and defining a principle axis that is substantially parallel to the basal plane.

The delocalized force cam include gravity, magnetic, electrostatic and/or electromagnetic. The invention can include stabilizing the non-random shared crystallographic orientation. Stabilizing can include fusing the plurality of anisotropic nanoparticles. Stabilizing can include changing a chemical composition of the substantially closed packed dense layer. Changing the chemical composition can include volatilization of a solvent. Stabilizing can include changing a local ionic concentration within the substantially close packed dense layer by forming a Helmholtz double layer, wherein the substantially close packed dense layer is located in one layer of the Helmholtz double layer. The plurality of anisotropic nanoparticles can include polar crystals. Stabilizing can include changing a composition of a medium that is coupled to the substantially closed packed dense layer. Stabilizing can include changing a pH of a medium that is coupled to the substantially closed packed dense layer.

The short range weak attractive force can includes Van der Waals attractive forces. Imposing the fluctuating force can include exciting the plurality of anisotropic nanoparticles with at least one activation energy source selected from the group consisting of electric, magnetic, electrostatic, electromagnetic, ultrasonic, acoustic and actinic.

The invention can include providing a plurality of isotropic nanoparticles coupled to the plurality of anisotropic nanoparticles and imposing the fluctuating force on the isotropic nanoparticles. Assembling can include arranging the plurality of anisotropic nanoparticles to have a local impurity concentration by volume of no more than approximately 25% different than an average impurity concentration by volume with respect to the substantially close packed dense layer. In a preferred embodiment, the local impurity concentration is sodium per unit volume.

The invention can include recrystallizing the substantially close packed dense layer. The invention can include chemically reacting the substantially close packed dense layer with a chemical reactant to yield a chemical product. Chemically reacting can result in topotactic growth of the substantially close packed dense layer. Chemically reacting can include exerting a pressure that is sufficient to substantially prevent escape of vapor from the substantially close packed dense layer, the chemical reactant and the chemical product.

The invention can include generating an electric field across the substantially close packed dense layer, the chemical reactant and the chemical product. In a preferred embodiment, the chemical product includes $Cu(In,Ga)_y(S,Se)_{1-y}$.

Embodiments of the invention can utilize data processing methods that transform near real-time signals from the nanoparticles undergoing processing to control/optimize that processing. For example, an embodiment of the invention can be combined with instrumentation to obtain state variable information representing the degree of alignment of the nanoparticles to actuate interconnected discrete hardware elements. For instance, an embodiment of the invention can include the use signals reflected from the nanoparticles undergoing alignment and/or a substrate upon which the alignment is taking place to characterize the achieved degree of alignment and thereby control the magnitude and duration of excitation from one or more mechanical interaction activation energy sources including electric, magnetic, electrostatic, electromagnetic (e.g., RF), acoustic (e.g., ultrasonic) and/or actinic (e.g., UV).

Highly Alligned Strucutres of Anisotropic Nanoparticles

Embodiments of the invention can include highly aligned structures of anisotropic nanoparticles. The anisotropic nanoparticles can have lattice parameters suitable for use as topotaxy reactants (initial products). By utilizing nanoparticles whose parameters are orientated in accord with their anisotropy, and then aligning a plurality of these nanoparticles, an initial product for topotaxy of deterministic size and shape can be fabricated.

FIG. 1 shows two aligned subsets of triangular nanoparticles 110, 120 that are different from one another with respect to composition. The invention can utilize end surface electrostatically charged particles (e.g., nanorods) based on anion and/or cation terminated end surfaces. The invention can also utilize edge surface electrostatically charged particles (e.g., nanorods) based on anion and/or cation terminated edge surfaces. It is important to appreciate that the difference in charge state can facilitate the nanoparticles to align heterogeneously. This can in turn be used to form a structure exhibiting a spatially alternating composition if the two subsets are different from one another in composition.

Figure 7A:
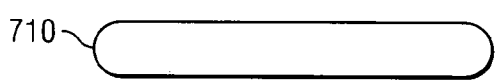
FIGS. 7A-7D are schematic sectional views of four different nanoparticle platelet minor plane profiles, representing embodiments of the invention.
Figure 7B:
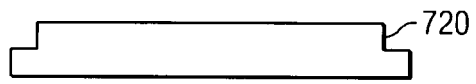
Figure 7C:
Figure 7D:

FIGS. 7A-7D are schematic sectional views of four different nanoparticle platelet profiles. These views illustrate minor plane profiles. FIG. 7A represents a nanoparticle having a radius edge profile 710. FIG. 7B represents a nanoparticle having a stepped edge profile 720. FIG. 7C represents a nanoparticle having an orthogonal edge profile 730. FIG. 7D represents a nanoparticle having a bevel edge profile 740. Of course, the invention is not limited to the depicted profiles.

The invention can include the use of nanoparticles that are manufactured using organic surfactant-nanoparticle interactions. Nanoparticles can be passivated or "capped" with long chain organic ligands and/or surfactants. Organic surfactants play a key role in determining the size and shape of nanoparticles during synthesis.[1] Preferential surface adhesion of ligands to crystal facets is critical in the growth and shape of the nanoparticle. Direct empirical observation of selective adhesion of surfactants has not been observed during nanocrystal growth, but theoretical studies and first-principles calculations support this mechanism.[1,2,3] Those facets most strongly bound to ligands are the slowest to grow. The relative ligand binding energy to different facets controls the relative growth rates of those facets and thus the resulting geometry.[3] If the nanocrystals have a highly symmetric crystal structure (e.g., Zn blend or rock-salt), synthesis frequently yields faceted crystals with no unique dimension of growth.[2] Polar facets are less stable and less efficiently passivated than nonpolar facets, which can rationalize the observed anisotropic growth mechanism of wurtzite nanocrystals.[2] For instance, $In_2Se_3$ can form a stable wurtzite structure, which can yield a hexagonal rod particle under appropriate conditions. The degree of surfactant coverage or surfactant density on a facet and the monomer density also affect the growth mechanism.[2]

The invention can also include the use of manufactured core/shell systems, for instance, involving the bonding of inorganic materials to nanoparticles. Nanocrystals capped by inorganic species can be referred to as "core/shell" systems. Examples of these systems include $CdSe/CdS$, $Si/SiO_2$, $CdS/Cd(OH)_2$, $CdSe/ZnSe$, $CdSe/ZnS$ and $CdS/HgS/CdS$.[4] Most of the systems studied are II-VI semiconductors that exhibit unique photoluminescent properties. The core nanocrystals are ~5 nm in diameter and the shells, which grow epitaxially on the core are ~0.5 nm in thickness.[4,5] The capping appears to occur uniformly over the nanocrystal and is not related to any specific crystallographic facet. Several conditions for depositing these materials exist, which include (1) the core must withstand the conditions under which the shell is deposited (2) the surface energies of the two phases must be similar so that the barrier for heterogeneous nucleation of the shell is lower than that for homogeneous nucleation and (3) the seed nanocrystal and the shell must not readily interdiffuse under the deposition conditions.[6]

The invention can also include the use of controlled morphology of Cu—In—Ga—Se nanoparticle compounds. The morphologies and dimensions of various Cu—In—Ga—Se nanoparticles are listed in the following table.

TABLE 1

| Material | Morphology | Dimensions (nm) | Reference |
| --- | --- | --- | --- |
| CIGS | Sphere | d~30-80 | 7 |
| CIGS | Plate | | 7 |
| CIGS | Sphere | d~30-80 | 8 |
| CIGS | Tube-like | w~200, l~microns | 9 |
| CIS | Rod | w~12, l~600 | 10 |
| CIS | Whisker-like | 3-6 × 30-80 | 11 |
| CIS | Sphere | d~15 | 11 |
| CIS | Sphere | 85 | 12 |
| CIS | Sphere | d~10-80 | 8 |
| CIS | Rod | w~5-10, l~10-30 | 8 |
| CuSe | Sphere | d~10-20 | 13 |
| $Cu_{2-x}Se$ | | 20-25 | 14 |
| $Cu_3Se_2$ | | 20-25 | 14 |
| CuSe | | 50-60 | 14 |
| InSe | Platelet, Tube, Sphere | | 19 |
| InSe | Platelet | | 20 |
| InSe | Rod | | 21 |
| InSe | Sphere | 5.8-7.0 | 22 |

The invention can include anisotropic nanoparticles that are arranged to define an order having three-dimensional translational periodicity and a rotational symmetry that is 4-fold with respect to a normal to a basal plane of the substantially close packed dense layer. The invention can include anisotropic nanoparticles that are arranged to define an order having three-dimensional translational periodicity and a rotational symmetry that is 6-fold with respect to a normal to a basal plane of the substantially close packed dense layer.

The invention can include the use of quasicrystal nanoparticles. The invention can utilize quasicrystals that are quasiperiodic in two dimensions (i.e., polygonal or dihedral quasicrystals).

In this case there is one periodic direction perpendicular to the quasiperiodic layers. These types include: octagonal quasicrystals with local 8-fold symmetry [primitive & body-centered lattices]; decagonal quasicrystals with local 10-fold symmetry [primitive lattice]; and dodecagonal quasicrystals with local 12-fold symmetry [primitive lattice]. The invention can include quasicrystals that define a rotational symmetry that is 10-fold with respect to a basal plane of the substantially close packed dense layer, a one-dimensional translational periodicity that is perpendicular to the basal plane, and that are ordered with respect to basal spatial location on a scale that is substantially a multiple of approximately five nanometers.

The invention can utilize quasicrystals that are quasiperiodic in three dimensions. In this case there is no periodic direction. These types include: icosahedral quasicrystals (axes:12×5-fold, 20×3-fold, 30×2-fold) [primitive, body-centered & face-centered lattices]; and "icosahedral" quasicrystal with broken symmetry (stable binary $Cd_{5.7}Yb$).

Examples of octagonal quasicrystals include: V—Ni—Si; Cr—Ni—Si; Mn—Si; Mn—Si—Al; and Mn—Fe—Si. Examples of decagonal quasicrystals include: Al—TM (where TM=Ir, Pd, Pt, Os, Ru, Rh, Mn, Fe, Co, Ni, Cr); Al—Ni—Co*; Al—Cu—Mn; Al—Cu—Fe; Al—Cu—Ni; Al—Cu—Co*; Al—Cu—Co—Si*; Al—Mn—Pd*; V—Ni—Si; and Cr—Ni. Examples of dodecagonal quasicrystals include: Cr—Ni; V—Ni; and V—Ni—Si. Examples of icosahedral quasicrystals include: Al—Mn; Al—Mn—Si; Al—Li—Cu*; Al—Pd—Mn*; Al—Cu—Fe; Al—Mg—Zn; Zn—Mg—RE* (where RE=La, Ce, Nd, Sm, Gd, Dy, Ho, Y); Ti-TM (where TM=Fe, Mn, Co, Ni); Nb—Fe; V—Ni—Si; and Pd—U—Si. In this paragraph, the use of "*" indicates that stable phases exist.

A perfectly aligned structure of anisotropic nanoparticles can have a free energy that is as low as a theoretical lowest free energy with respect to the structure. Embodiments of the invention can have a free energy no more than approximately 90, 80, 70, 60, 50, 40, 30, 20, 10, 5, or 1 percent above a theoretical lowest free energy with respect to the structure.

While not being limited to any particular performance indicator or diagnostic identifier, preferred embodiments of the invention can be identified one at a time by testing for the presence of spatially resolved gaps between the nanoparticles. The test for the presence of alignment can be carried out without undue experimentation by the use of a simple and conventional transmitting electron microscopy experiment.

Impurity Distributed Structures of Anisotropic Nanoparticles

Embodiments of the invention can include impurity distributed structures of anisotropic nanoparticles. By providing an impurity at a controlled location on the surface of an anisotropic nanoparticle, and then arranging a plurality of such nanoparticles. the impurity can be distributed within the structure defined by the plurality of nanoparticles.

The invention can include anisotropic nanoparticles that include an impurity and have a local impurity concentration by volume of no more than 25% different than an average impurity concentration by volume with respect to the substantially close packed dense layer. A preferred embodiment of the invention is directed to a local impurity concentration of sodium per unit volume.

Figure 4:
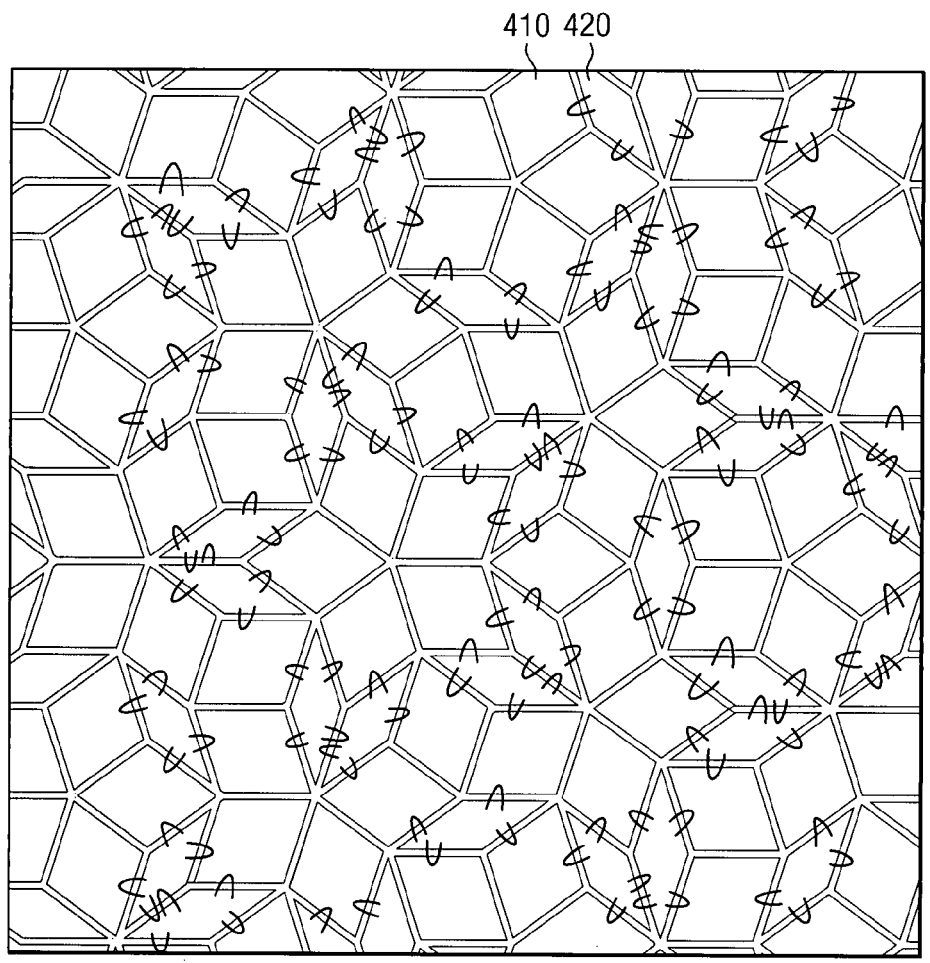
FIG. 4 is a schematic plan view of two aligned subsets of quasicrystal nanoparticles, one of which bears an impurity on their edges, representing an embodiment of the invention.

FIG. 4 shows two aligned subsets of nanoparticles 410, 420, of which nanoparticles 420 bear an impurity on their edges. These two subsets of nanoparticles are aligned to define a layer, film or coating with 5-fold symmetry with respect to a basal plane.

Figure 6:
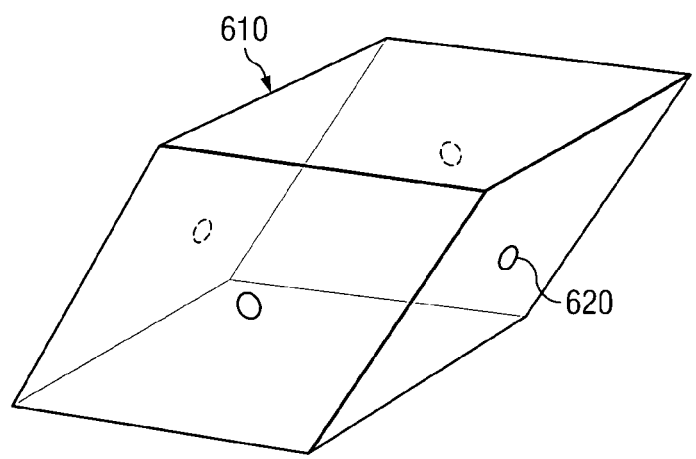
FIG. 6 is a schematic perspective view of a nanoparticle having an impurity on four sides, representing an embodiment of the invention.

FIG. 6 shows a nanocrystal 610 having an impurity 620 on four sides. These nanocrystals can be aligned to define of layer, film or coating of rombohedrons.

Some embodiments of the invention can include locating an impurity within the interior of a nanoparticle. Alternatively, some embodiments of the invention can include locating the impurity at the surface of a nanoparticle. In the case of nanoparticle platelets or circular x-section rods, or hexagonal x-section rods that are going to be arranged in a basal plane, it can be advantageous to locate the impurity at the edge of the platelets so that the impurity is distributed at the nanoparticle interfaces. For instance, sodium can be provided on the surface of $(In,Ga)_y(S,Se)_{1-y}$, $Cu_x(Se)_{1-x}$, or $Cu(In,Ga)_y(S,Se)_{1-y}$. nanoparticles by providing the sodium in the form of a surfactant, for example sodium bis(2-ethylhexyl)sulphosuccinate) or diisooctyl sodium sulfosuccinate or sodium dodecylsulphate (SDS) or Sodium Lauryl Sulfate (SLS). It can be appreciated that these surfactants can provide the sodium on the surface (e.g., edge) of the nano-particles(-platelets) while simultaneously stabilizing the growth of the particles (platelets). Alternatively, impurities can be provided on the surface by ligand exchange. Such an exchange can include exposure (optionally repeatedly) to an excess competing capping group, followed by precipitation to isolate the partially exchanged nanoparticles.

A structure with a perfectly distributed impurity can have a local impurity concentration that is the same as an average impurity concentration by volume with respect to the structure. Embodiments of the invention can have a local impurity concentration by volume of no more than approximately 90, 80, 70, 60, 50, 40, 30, 20, 10, 5, or 1 percent different than an average impurity concentration by volume with respect to the structure.

While not being limited to any particular performance indicator or diagnostic identifier, preferred impurity distributed embodiments of the invention can be identified one at a time by testing for the spatially resolved presence of the impurity element(s). The test for the presence of alignment can be carried out without undue experimentation by the use of a simple and conventional scanning probe microscopy experiment.

EXAMPLES

Specific embodiments of the invention will now be further described by the following, nonlimiting examples which will serve to illustrate in some detail various features. The following examples are included to facilitate an understanding of ways in which an embodiment of the invention may be practiced. It should be appreciated that the examples which follow represent embodiments discovered to function well in the practice of the invention, and thus can be considered to constitute preferred mode(s) for the practice of the embodiments of the invention. However, it should be appreciated that many changes can be made in the exemplary embodiments which are disclosed while still obtaining like or similar result without departing from the spirit and scope of an embodiment of the invention. Accordingly, the examples should not be construed as limiting the scope of the invention.

Example 1

Figure 2:
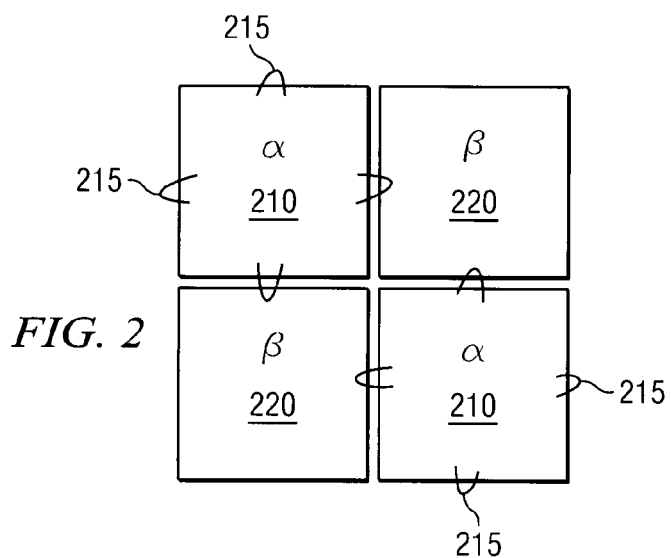
FIG. 2 is a schematic plan view of two aligned subsets of nanoparticles, one of which bears an impurity on their edges, representing an embodiment of the invention.

Referring to FIG. 2, an embodiment of the invention can include a composition of matter including a structure defining 4-fold symmetry; and a process of making this composition. In this example, the plurality of anisotropic nanoparticles are cubic platelets.

FIG. 2 shows two aligned subsets of square $Cu(In,Ga)_y(S,Se)_{1-y}$. nanoparticles 210, 220, one of which 210 bears a residual sodium bis(2-ethylhexyl)sulphosuccinate) impurity 215 on their edges. In the context of $Cu(In,Ga)_y(S,Se)_{1-y}$, the nanoparticles 210 can correspond to copper rich alpha domains while the nanoparticles 220 can correspond to indium-gallium rich beta domains. By combining the two subsets in a 50/50 ratio, the amount of impurity is controlled to be 50% relative to what it would be if only the impurity bearing nanoparticles were utilized. The impurity bearing edges can join preferentially with the non-impurity bearing edges and, therefore, the 50% relative impurity level is evenly distributed at a local scale, albeit not at a nearest neighbor scale.

Example 2

Figure 5:
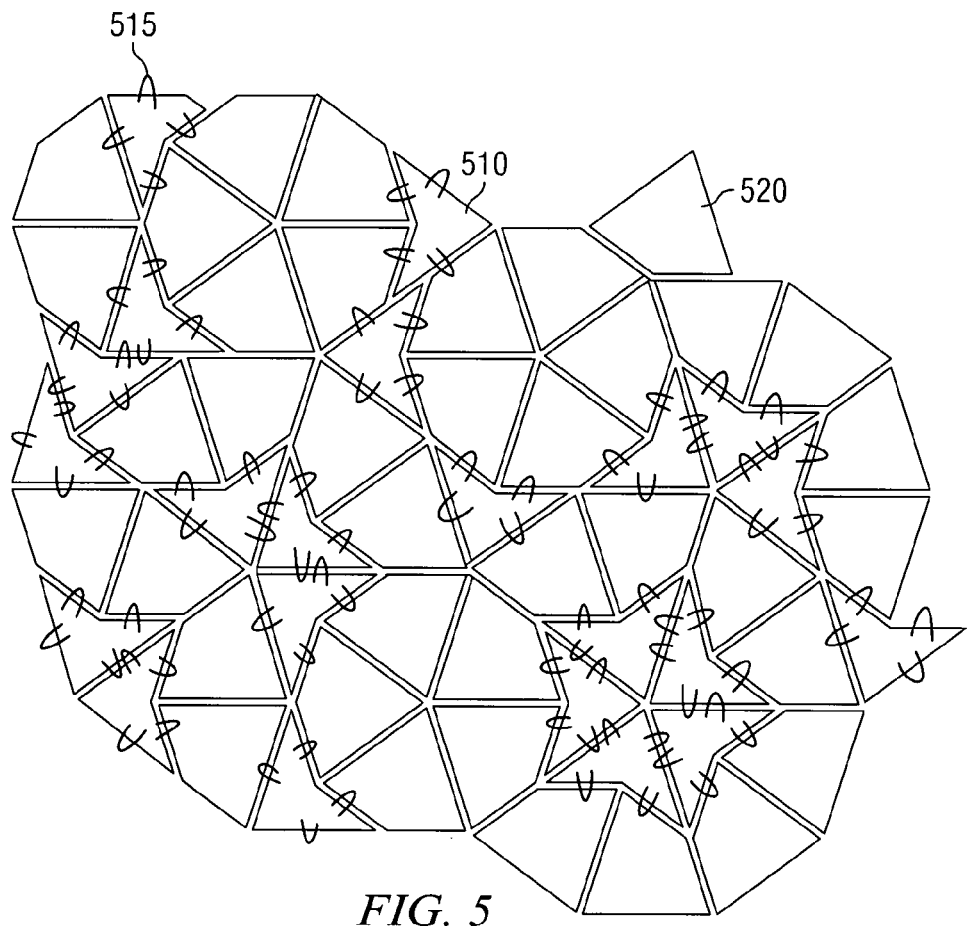
FIG. 5 is a schematic plan view of two aligned subsets of quasicrystal nanoparticles, one of which bears an impurity on their edges, representing an embodiment of the invention.

Referring to FIG. 5, an embodiment of the invention can include a composition of matter including a structure defining 5-fold symmetry; and a process of making this composition. In this example, the plurality of anisotropic nanoparticles includes a first subset and a second subset.

FIG. 5 shows the two aligned subsets of $(In,Ga)_y(S,Se)_{1-y}$, nanoparticles 510, 520, one of which 510 bears a residual diisooctyl sodium sulfosuccinate impurity 515 on their edges. By providing the impurity on only one of the two subsets, the amount of impurity is controlled to be lower relative to what it would be if both of the subsets bore the impurity. It is important to appreciate that the impurity level is evenly distributed on a local scale, albeit not at a nearest neighbor scale. A plurality of these nanoquasicrystals can be aligned to form a layer, film or coating with 5-fold symmetry with respect to a basal plane.

Example 3

Figure 3:
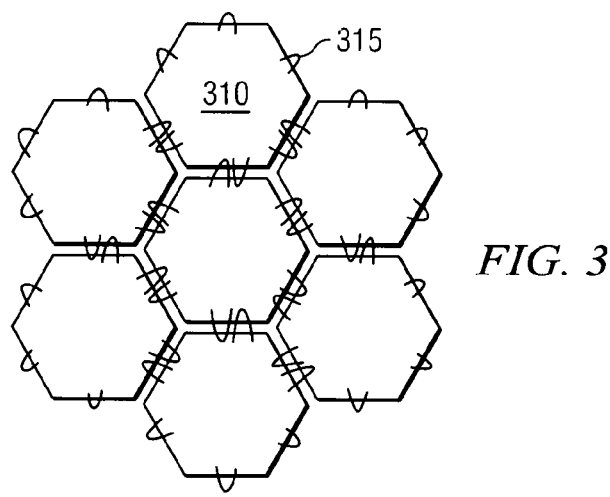
FIG. 3 is a schematic plan view of an aligned plurality of hexagonal nanoparticles, all of which bear an impurity on their edges, representing an embodiment of the invention.

Referring to FIG. 3, an embodiment of the invention can include a composition of matter including a structure defining 6-fold symmetry; and a process of making this composition. In this example, the plurality of anisotropic nanoparticles are hexagonal.

FIG. 3 shows an aligned plurality of hexagonal $Cu_x(Se)_{1-x}$. nanoparticles 310, all of which bear a residual sodium dodecylsulphate impurity 315 on their edges. It is important to appreciate that the impurity level is evenly distributed at a local scale, as well as at a nearest neighbor scale.

Example 4

Figure 8:
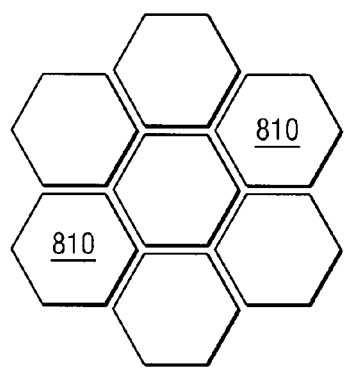
FIG. 8 is a schematic view of a $In_2Se_3$ structure defining a 6-fold rotational symmetry with respect to a normal to a plane of a substantially dense close packed layer, representing an embodiment of the invention.

Referring to FIG. 8, an embodiment of the invention can include a composition of matter including a $In_2Se_3$ structure defining 6-fold rotational symmetry with respect to a normal to the plane of the substantially dense close packed layer; and a process of making this composition. FIG. 8 shows an aligned plurality of hexagonal $In_2Se_3$ nanorods 810, each of which is formed by a stable wurtzite structure. The degree of surfactant coverage or surfactant density on the ends of the rods and the corresponding monomer density is lower compared to the six side facets.

Practical Applications

A practical application of an embodiment of the invention that has value within the technological arts is preparing a chemical precursor layer for subsequent use in a chemical reaction, for example, a pressure contained chemical reaction that includes one or more trace moieties (for instance a surfactant) that are advantageously homogeneously distributed in the precursor layer. Further, embodiments of the invention are useful in conjunction with preparing dye sublimation plates (such as are used for the purpose of printing), or in conjunction with nano fabrication techniques (such as are used for the purpose of quantum device manufacture), or the like. There are virtually innumerable uses for embodiments of the invention, all of which need not be detailed here.

Advantages

Embodiments of the invention can be cost effective and advantageous for at least the following reasons. Embodiments of the invention improve quality and/or reduce costs compared to previous approaches.

Definitions

The phrase aspect ratio is intended to mean the ratio of length to average of height and width with respect to a (nano) particle. The phrase principal plane is intended to mean the plane located by a normal that is parallel to the shortest dimension of a (nano)particle. The phrase local impurity concentration by volume is intended to mean the amount of an impurity per unit volume in the vicinity of a group of (e.g., 10-100) nanoparticles; and not proximate an individual nanoparticle or adjacent a nearest neighbor nanoparticle. The phrase average impurity concentration by volume is intended to mean the amount of an impurity within a bulk defined by the plurality of anisotropic nanoparticles. The phrase ultrasonic frequency is intended to mean frequencies greater than or equal to approximately 20 KHz. The phrase radio frequency is intended to mean frequencies less than or equal to approximately 300 GHz as well as the infrared spectrum. Group numbers corresponding to columns within the periodic table of the elements use the "New Notation" convention as seen in the CRC Handbook of Chemistry and Physics, $81^{st}$ Edition (2000).

The term substantially is intended to mean largely but not necessarily wholly that which is specified. The term approximately is intended to mean at least close to a given value (e.g., within 10% of). The term generally is intended to mean at least approaching a given state. The term coupled is intended to mean connected, although not necessarily directly, and not necessarily mechanically. The term proximate, as used herein, is intended to mean close, near adjacent and/or coincident; and includes spatial situations where specified functions and/or results (if any) can be carried out and/or achieved. The term distal, as used herein, is intended to mean far, away, spaced apart from and/or non-coincident, and includes spatial situation where specified functions and/or results (if any) can be carried out and/or achieved.

The terms first or one, and the phrases at least a first or at least one, are intended to mean the singular or the plural unless it is clear from the intrinsic text of this document that it is meant otherwise. The terms second or another, and the phrases at least a second or at least another, are intended to mean the singular or the plural unless it is clear from the intrinsic text of this document that it is meant otherwise. Unless expressly stated to the contrary in the intrinsic text of this document, the term or is intended to mean an inclusive or and not an exclusive or. Specifically, a condition A or B is satisfied by any one of the following: A is true (or present) and B is false (or not present), A is false (or not present) and B is true (or present), and both A and B are true (or present). The terms a and/or an are employed for grammatical style and merely for convenience.

The term plurality is intended to mean two or more than two. The term any is intended to mean all applicable members of a set or at least a subset of all applicable members of the set. The phrase any integer derivable therein is intended to mean an integer between the corresponding numbers recited in the specification. The phrase any range derivable therein is intended to mean any range within such corresponding numbers. The term means, when followed by the term "for" is intended to mean hardware, firmware and/or software for achieving a result. The term step, when followed by the term "for" is intended to mean a (sub)method, (sub)process and/or (sub)routine for achieving the recited result.

The terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. The terms "consisting" (consists, consisted) and/or "composing" (composes, composed) are intended to mean closed language that does not leave the recited method, apparatus or composition open to the inclusion of procedures, structure(s) and/or ingredient(s) other than those recited except for ancillaries, adjuncts and/or impurities ordinarily associated therewith. The recital of the term "essentially" along with the term "consisting" (consists, consisted) and/or "composing" (composes, composed), is intended to mean modified close language that leaves the recited method, apparatus and/or composition open only for the inclusion of unspecified procedure(s), structure(s) and/or ingredient(s) which do not materially affect the basic novel characteristics of the recited method, apparatus and/or composition.

Unless otherwise defined, all technical and scientific terms used herein have the same meaning as commonly understood by one of ordinary skill in the art to which this invention belongs. In case of conflict, the present specification, including definitions, will control.

Conclusion

The described embodiments and examples are illustrative only and not intended to be limiting. Although embodiments of the invention can be implemented separately, embodiments of the invention may be integrated into the system(s) with which they are associated. All the embodiments of the invention disclosed herein can be made and used without undue experimentation in light of the disclosure. Although the best mode of the invention contemplated by the inventor(s) is disclosed, embodiments of the invention are not limited thereto. Embodiments of the invention are not limited by theoretical statements (if any) recited herein. The individual steps of embodiments of the invention need not be performed in the disclosed manner, or combined in the disclosed sequences, but may be performed in any and all manner and/or combined in any and all sequences. The individual components of embodiments of the invention need not be formed in the disclosed shapes, or combined in the disclosed configurations, but could be provided in any and all shapes, and/or combined in any and all configurations. The individual components need not be fabricated from the disclosed materials, but could be fabricated from any and all suitable materials. Homologous replacements may be substituted for the substances described herein.

It can be appreciated by those of ordinary skill in the art to which embodiments of the invention pertain that various substitutions, modifications, additions and/or rearrangements of the features of embodiments of the invention may be made without deviating from the spirit and/or scope of the underlying inventive concept. All the disclosed elements and features of each disclosed embodiment can be combined with, or substituted for, the disclosed elements and features of every other disclosed embodiment except where such elements or features are mutually exclusive. The spirit and/or scope of the underlying inventive concept as defined by the appended claims and their equivalents cover all such substitutions, modifications, additions and/or rearrangements.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

REFERENCES

1. Yin et al., *Nature*, Colloidal nanocrystal synthesis and the organic-inorganic interface, 437, 664-670, 2005
2. Manna et al., *J.Phys.Chem. B.*, First-Principles Modeling of Unpassivated and Surfactant-Passivated Bulk Facets of Wurtzite CdSe: A Model System for Studying the Anisotropic Growth of CdSe Nanocrystals, 109, 6183-6192, 2005.
3. Puzder et al., *Nanno Letters*, The Effect of Organic Ligand Binding on the Growth of CdSe Nanoparticles Probed by Ab Initio Calculations, 4, 2361-2365, 2004.
4. Peng, *J. Am.Chem.Soc.*, Epitaxial Growth of Highly Luminescent CdSe/CdS Core/Shell Nanocrystals with Photostability and Electronic Accessibility, 119, 7019-7029, 1997.
5. Hua et al., *Chem.Phys.Lett.*, Electroluminescent properties of device based on ZnS:Tb/CdS core-shell nanocrystals, 419, 269-272, 2006.
6. Murray et al., *Ann. Rev. Mat. Sci.*, Synthesis and Characterization of Monodisperse Nanocrystals and Close-Packed Nanocrystal Assemblies, 30, 545-610, 2000.
7. Chun et al., *Thin Solid Films*, Synthesis of $CuInGaSe_2$ nanoparticles by solvothermal route, 480-481, 46-49, 2005.
8. Kim et al., *Matl. Sci. Forum*, Synthesis of $CuInSe_2$ and $CuInGaSe_2$ nanoparticles by solvothermal route, 449-4, 273-276, 2004.
9. Kim et al., *J.Mech.Sci.&Tech.*, Synthesis of $CuInGaSe_2$ nanoparticles by low temperature colloidal route, 19, 2085-2090, 2005.
10. Jiang et al., *Inorg. Chem.*, Elemental Solvothermal Reaction To Produce Ternary Semiconductor $CuInE_2$ (E=S, Se) Nanorods, 39, 2964-2965, 2000.
11. Li et al., *Advanced Materials*, Synthesis by a Solvothermal Route and Characterization of $CuInSe_2$ Nanowhiskers and Nanoparticles, 11, 1456-1459, 1999.
12. Grisaru et al., *Inorganic Chemistry*, Microwave-Assisted Polyol Synthesis of $CuInTe_2$ and $CuInSe_2$, 42, 7148-7155, 2003.
13. Li et al., *J. Mat. Chem.*, Sonochemical process for the preparation of ☐CuSe nanocrystals and flakes, 12, 3723-3727, 2002.
14. Xu et al., *J. Crys. Growth.*, Sonochemical synthesis of copper selenides nanocrystals with different phases, 234, 263-266, 2002.
15. Kumar et al., *Small*, Shape Control of II-VI Semiconductor Nanomaterials, 2, 316-329, 2006.
16. Burda et al., *Chem. Rev.*, Chemistry and Properties of Nanocrystals of Different Shapes, 104, 1025-1102, 2005.
17. Yu et al., *Chem. Mater.*, Formation and Stability of Size-, Shape-, and Structure-Controlled CdTe Nanocrystals: Ligand Effects on Monomers and Nanocrystals, 15, 4300-4308, 2003.
18. Caspar et al., *Proc. Natl. Acad. Sci.*, Five-fold symmetry in crystalline quasicrystal lattices, Vol. 93, 14271-14278, December 1996.
19. Hollingsworth et al., *J. Am Chem. Soc.*, Catalyzed Growth of a Metastable InS Crystal Structure as Colloidal Crystals, 122, 3562-3563, March 2000.
20. Yang et al., *J. Phys. Chem. B*, The Spectroscopy of InSe Nanoparticles, Vol. 109, 12701-12709, June 2005.
21. Park et al, *J. Am. Chem. Soc.*, Phase-Controlled One-Dimensional Shape Evolution of InSe Nanocrystals, Vol. 128, 14780-14781, August 2006.
22. Revaprasadu et al., *J. Mater. Chem.*, Novel single-molecule precursor routes for the direct synthesis of InS and InSe quantum dots, Vol. 9, 2885-2888, August 1999.

What is claimed is:

1. A composition of matter, comprising:
a plurality of anisotropic nanoparticles that are in physical contact with one another, wherein the plurality of nanoparticles includes a member selected from the group consisting of $(In,Ga)_y (S.Se)_{1-y}$, an $In_2Se_3$ stable wurtzite structure that defines a hexagonal rod nanoparticle, $Cu_x(Se)_{1-x}$, and $Cu(In,Ga)_{1-y}(S,Se)_{1-y}$, each of the plurality of anisotropic nanoparticles having a) a first dimension that is substantially different than both a second dimension and a third dimension and b) a non-random nanoparticle crystallographic orientation that is substantially aligned with the first dimension,
wherein the plurality of anisotropic nanoparticles are substantially aligned with respect to each other to define a substantially close packed dense layer having a non-random shared crystallographic orientation that is substantially aligned with a basal plane of the substantially close packed dense layer,
wherein the plurality of anisotropic nanoparticles are arranged to define an order having one-dimensional translational periodicity and a rotational symmetry selected from the group consisting of 8-fold, 10-fold and 12-fold with respect to a normal to the basal plane of the substantially close packed dense layer.

2. The composition of matter of claim 1, wherein the substantially close packed dense layer is characterized by a packing factor that is within at least 10% of a maximum packing factor.

3. The composition of matter of claim 1, further comprising a plurality of isotropic nanoparticles coupled to the plurality of anisotropic nanoparticles.

4. The composition of matter of claim 1, wherein each of the plurality of anisotropic nanoparticles defines a platelet a) having an aspect ratio of less than approximately 0.20 and b) defining a principle plane that is substantially parallel to the basal plane.

5. The composition of matter of claim 1, wherein the plurality of anisotropic nanoparticles includes a first set of anisotropic nanoparticles and a second set of anisotropic nanoparticles, wherein the first set of anisotropic nanoparticles and the second set of anisotropic nanoparticles are different from one another with regard to at least one state variable selected from the group consisting of principle plane plan, minor plane profile, impurity presence, electrostatic edge charge, electrostatic surface charge, edge acidity, surface acidity, edge hydrophilicity and surface hydrophilicity.

6. The composition of matter of claim 1, wherein the rotational symmetry is 10-fold with respect to a normal to the basal plane of the substantially close packed dense layer, the one-dimensional translational periodicity is perpendicular to the basal plane, and the plurality of anisotropic nanoparticles are ordered with respect to basal spatial location on a scale that is substantially a multiple of approximately five nanometers.

7. The composition of matter of claim 1, wherein the plurality of anisotropic nanoparticles are arranged to define an order having three-dimensional translational periodicity and a rotational symmetry selected from the group consisting of 4-fold and 6-fold, with respect to a normal to the basal plane of the substantially close packed dense layer.

8. The composition of matter of claim 1, wherein each of the plurality of anisotropic nanoparticles includes $(In,Ga)_y(S,Se)_{1-y}$.

9. The composition of claim 8, wherein each of the plurality of anisotropic nanoparticles includes an $In_2Se_3$ stable wurtzite structure that defines a hexagonal rod nanoparticle.

10. The composition of matter of claim 1, wherein each of the plurality of anisotropic nanoparticles includes $Cu_x(Se)_{1-x}$.

11. The composition of matter of claim 1, wherein each of the plurality of anisotropic nanoparticles includes $Cu(In,Ga)_y(S,Se)_{1-y}$.

12. The composition of matter of claim 1, wherein the plurality of anisotropic nanoparticles include an impurity and have a local impurity concentration by volume of no more than 25% different than an average impurity concentration by volume with respect to the substantially close packed dense layer.

13. The composition of matter of claim 12, wherein the local impurity concentration is sodium per unit volume.

14. The composition of matter of claim 1, further comprising a substrate coupled to the substantially close packed dense layer.

15. The composition of matter of claim 1, wherein the plurality of anisotropic nanoparticles are fused.

16. The composition of matter of claim 1, wherein the plurality of anisotropic nanoparticles are recrystallized.

* * * * *